United States Patent
Pascucci

(10) Patent No.: US 6,351,434 B2
(45) Date of Patent: Feb. 26, 2002

(54) SYNCHRONOUS COUNTER FOR ELECTRONIC MEMORIES

(75) Inventor: Luigi Pascucci, Sesto San Giovanni (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/767,762

(22) Filed: Jan. 23, 2001

(30) Foreign Application Priority Data

Feb. 14, 2000 (EP) .......................................... 00830100

(51) Int. Cl.[7] ................................................ G11C 8/00
(52) U.S. Cl. ...................................................... 365/236
(58) Field of Search ................................. 365/236, 233, 365/239

(56) References Cited

U.S. PATENT DOCUMENTS

| | | | |
|---|---|---|---|
| 5,339,344 A | * 8/1994 | Kimura et al. | 365/236 |
| 5,361,365 A | 11/1994 | Hirano et al. | 395/775 |
| 5,561,674 A | 10/1996 | Cho | 377/55 |
| 5,781,500 A | 7/1998 | Oh | 365/233 |
| 5,825,713 A | 10/1998 | Lee | 365/230.05 |

OTHER PUBLICATIONS

Patent Abstracts of Japan, vol. 006, No. 128 (E–118), Jul. 14, 1982 & JP 57 054432 A (Hitachi Ltd.) Mar. 31, 1982 *abstract*.

Patent Abstracts of Japan, vol. 011, No. 143 (E–504), May 9, 1987 & JP 61 281622 A (Mitsubishi Electric Corp.) Dec. 12, 1986 *abstract*.

Patent Abstracts of Japan, vol. 011, No. 355 (E–558) Nov, 19, 1987 & JP 62 132425 A (NEC Corp.), Jun. 15, 1987 *abstract*.

Patent Abstracts of Japan, vol. 014, No. 154 (E–0907), Mar. 23, 1990 & JP 02 13128 A (Sharp Corp.), Jan. 17, 1990 *abstract*.

* cited by examiner

Primary Examiner—Tan T. Nguyen
(74) Attorney, Agent, or Firm—Lisa K. Jorgenson; Allen, Dyer, Doppelt, Milbrath & Gilchrist, P.A.

(57) ABSTRACT

A memory counter circuit includes a plurality of mutually connected counter stages, an internal address bus interfaced with each one of the counter stages for sending an external address signal to each one of the counter stages, a circuit for loading the external address signal onto the internal address bus, and an enabling circuit for enabling a connection between the internal bus and each one of the counter stages. The enabling circuit may be driven by a true address latch enable signal. The memory counter circuit may further include a circuit for generating the true address latch enable signal starting from an external address latch signal and a fast address latch enable signal for driving the circuit for loading the external address signal onto the internal address bus. A signal generation circuit may also be included for generating clock signals for synchronizing each one of the counter stages. The synchronization signals are preferably not simultaneously active.

36 Claims, 3 Drawing Sheets

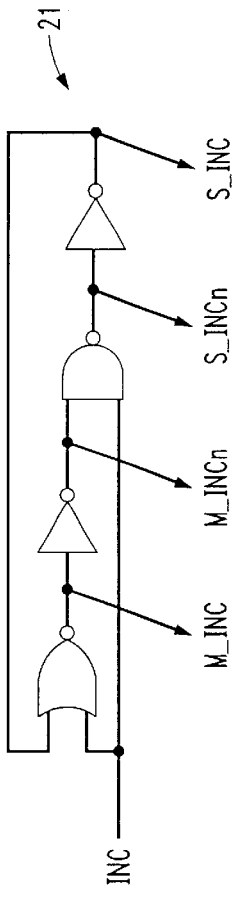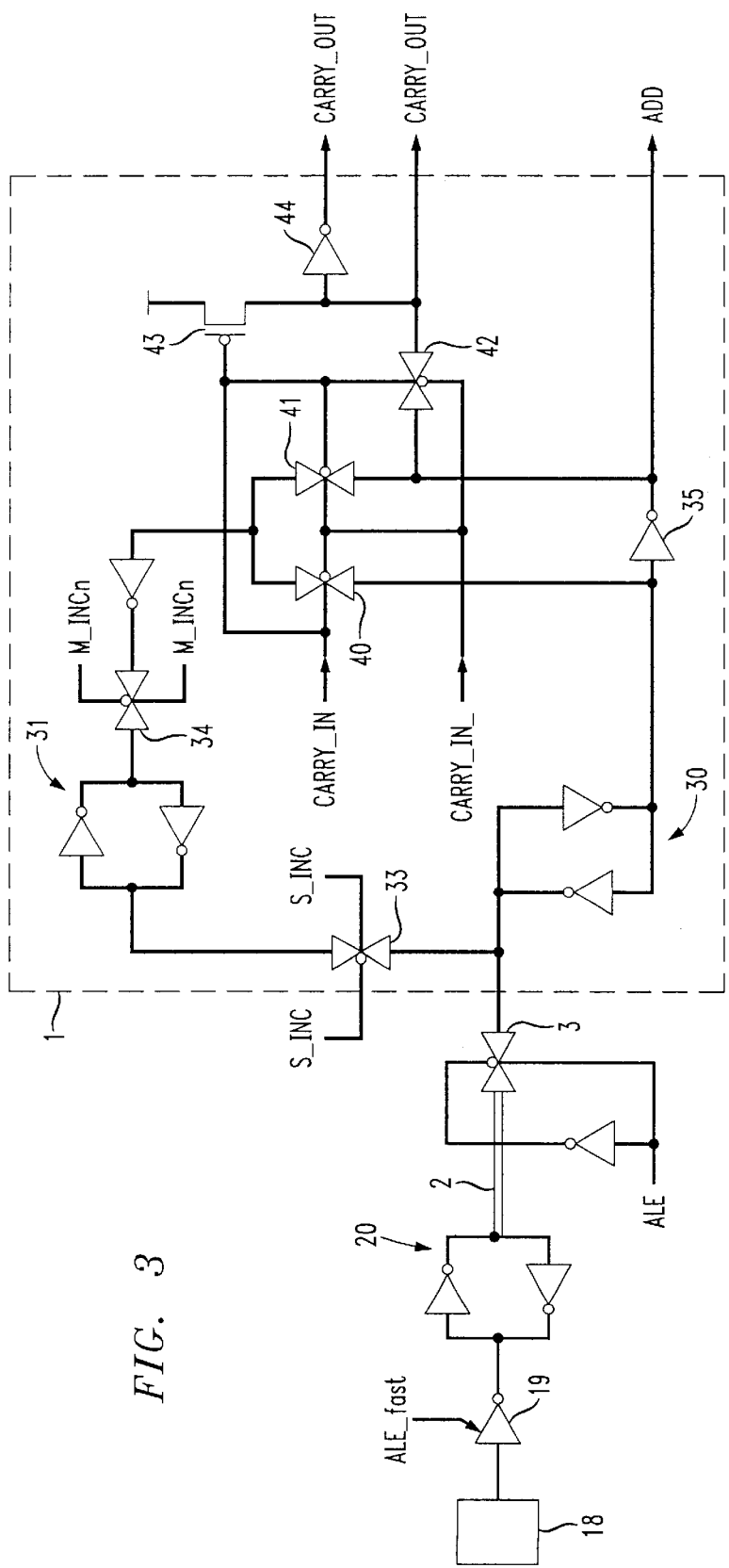

SYNCHRONOUS COUNTER FOR ELECTRONIC MEMORIES

FIELD OF THE INVENTION

The present invention relates to the field of electronic circuits, and, more particularly, to a synchronous counter for electronic memories. Moreover, the invention relates to a fast synchronous counter for memories which is faster than conventional counters.

BACKGROUND OF THE INVENTION

In an electronic memory, for example of the non-volatile type, the structures that make up the memory are formed to ensure a normal read cycle. This read cycle begins with a request stimulus (i.e., switching of the addressing lines) and ends with the extraction of the data related to the addressed memory location.

In view of their construction characteristics, these conventional memories are capable of performing only one reading process at a time. Furthermore, each read cycle is identical to every other in terms of response of the memory. In order to be able to provide an efficient read cycle whose outcome is certain, it is necessary to allow the entire propagation of the read stimuli to evolve completely and always in the same manner to be able to extract the data from the memory.

It is in fact not possible to produce a new read stimulus before a preceding activation has ended without a resultant "penalty" of interrupting and suppressing the previously started process. In practice, the second read process overlaps the first one, cancels it, and replaces it. Accordingly, a read cycle for a memory of a conventional type is penalized by long read times for each read cycle. Each read cycle has the same duration as all other read cycles.

The overall duration of a read cycle is given by the sum of elementary signal propagation times, and in particular: address transition request detection (signal ATD); identification of the memory location to be read (addressing); selection of the paths for access to the location to be read (word line, bit line); pre-charging of the data lines (PC); evaluation of the responses of the individual memory cells by a sense amplifier; and transfer of the read data to the output analysis time memories (buffer).

The read times for each read cycle remain unchanged even if the new location to be read is adjacent to a location read in the directly preceding cycle. In this case it would be advantageous to be able to utilize the fact that the new read occurs in a position which is physically close to the preceding read position to provide increased read speed.

Moreover, the need to manufacture electronic memories whose functionality is guaranteed requires subjecting the memories to tests of various kinds. Among these tests, it is important to be able to verify the correct operation of the counter by a dedicated line. Conventional memories do not allow for monitoring the counter from outside thereof due to the carry propagation time.

SUMMARY OF THE INVENTION

An object of the present invention is to provide a synchronous counter for electronic memories which may be used with memories of the interleaved type and thus may be synchronized with an external control signal for reading the memory.

Another object of the present invention is to provide a synchronous counter for electronic memories whose configuration may be defined substantially immediately from outside the counter at each count start.

Still another object of the present invention is to provide a synchronous counter for electronic memories which may be updated internally during counting.

Yet another object of the present invention is to provide a synchronous counter for electronic memories which is substantially functionally insensitive to external stimuli during counting.

A further object of the present invention is to provide a synchronous counter for electronic memories whose functionality may be monitored from outside the memory without requiring additional circuits.

Still another object of the present invention is to provide a synchronous counter for electronic memories which is protected against unwanted loading of addresses which are not expressly intended for the memory.

Yet another object of the present invention is to provide a synchronous counter for electronic memories which allows for assignment of the maximum possible time for carry calculation, maximizing the operating frequency.

A further object of the present invention is to provide a synchronous counter for electronic memories in which the corresponding control signals are not simultaneously active.

Another object of the present invention is to provide a synchronous counter for electronic memories which is highly reliable and relatively easy to manufacture at competitive costs.

These objects and others, which will become apparent hereinafter, are provided by a memory counter circuit that includes a plurality of mutually connected counter stages, an internal address bus interfaced with each one of the counter stages for sending an external address signal to each one of the counter stages, and a circuit or means for loading the external address signal onto the internal address bus. The memory counter may further include an enabling circuit or means for enabling the connection between the internal bus and each one of the counter stages. This enabling means may be driven by a true address latch enable signal. Furthermore, the memory counter may also include a circuit or means for generating the true address latch enable signal starting from an external address latch signal and a fast address latch enable signal. The fast address latch enable signal may be adapted to drive the means for loading the external address onto the internal address bus. Additionally, a signal generation circuit for generating clock signals for synchronizing each one of the counter stages is also included. The synchronization signals are preferably not simultaneously active.

BRIEF DESCRIPTION OF THE DRAWINGS

Further characteristics and advantages of the invention will become apparent from the description of a preferred, but not exclusive, embodiment of a synchronous counter according to the invention, illustrated only by way of non-limitative example in the accompanying drawings, wherein:

FIG. 2 is a schematic circuit diagram of a clock or timing generation circuit used in the synchronous counter according to the invention;

FIG. 3 is a schematic circuit diagram of a stage of the counter according to the present invention.

DETAILED DESCRIPTION OF THE PREFERRED EMBODIMENTS

Figure 1:
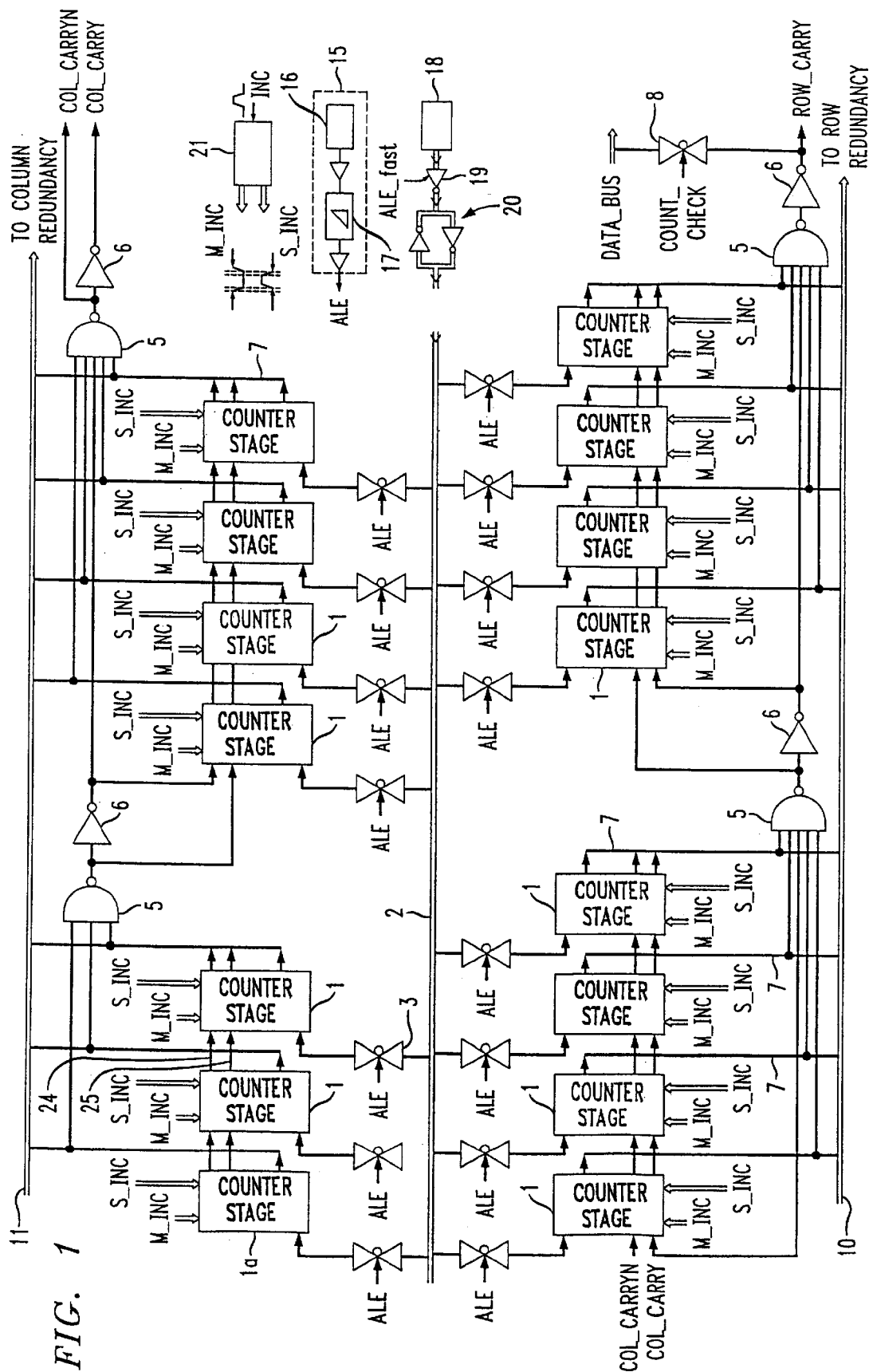
FIG. 1 is a schematic block diagram of a synchronous counter according to the present invention.

Before describing in detail the counter according to the invention, the following preamble should be made. Co-pending patent applications also assigned to the present assignee disclose a memory of the so-called interleaved type which allows selection of adjacent locations following read addresses of adjacent memory cells. In practice, if a read address points to a memory cell which is adjacent to a cell that has just been read, the memory does not repeat all the signal propagation times in order to address the intended location. Instead, it utilizes the previously performed addressing to read the data of the location adjacent to the one that has just been read.

For this purpose, the memory uses interleaved read streams which allow a reduction, by at least half, of the access time and the cycle time. In this type of memory, the memory array is advantageously organized into two functionally identical banks capable of allowing the development of two simultaneous read processes. The two read processes, which are simultaneously active but independent, are appropriately synchronized with respect to each other. They are also advantageously concatenated to ensure the evolution of the read cycles on two banks in an interleaved mode and to allow (without any reduction in the read intervals) halving of the signal propagation times. Therefore, ultimately, a much faster reading of the memory cells is provided.

Each one of the separate memory banks has its own independent addressing system. Yet, at the same time the addressing systems are mutually compatible and may be mutually synchronized with an external timing signal which sets their timing. The addressing system must have the characteristic of being directly configurable from outside the memory. It must also have an entirely autonomous updating capability, handled inside the memory, under the control of a stimulus which is activated externally to the memory.

The synchronous counter according to the present invention, particularly adapted for memories of the interleaved type, is now described with reference to FIGS. 1 to 4. Memories of the interleaved type, which are the subject of co-pending patent applications also assigned to the present assignee, utilize the situation in which the new location to be read is adjacent to the previously read location to provide faster memory reading.

The selection of adjacent memory locations, especially if they are numerous, allows a great reduction in the individual and overall read time of the memory. Adjacency allows the possibility of sequential reads, which are inherently associated with the concept of predictability of the subsequent location to be read. The possibility of taking advantage of adjacency is the main characteristic of the interleaved memory type, which is characterized by interleaved read streams. This approach allows a reduction (by at least half) of both the time for access to the memory and the cycle time.

In this type of memory, the memory array is conveniently organized into two separate memory banks. These memory banks are functionally dual and allow the simultaneous existence of two read processes. The two simultaneously active but independent read processes are mutually appropriately synchronized and concatenated. This is done to ensure the evolution of the read cycles on the two separate banks in interlaced mode and to allow, without any reduction in the read intervals, halving of the read signal propagation times. The data, extracted alternatively from the two memory banks, allows for a reduction of the overall read times.

The two separate banks that form the memory of the interleaved type each have their own independent addressing system. Yet, at the same time the addressing systems can be mutually synchronized by an external timing signal which regulates their evolution times. The addressing system must have the characteristic of being directly configurable externally but also of having the possibility of autonomous updating, handled inside the memory itself, under the control of a stimulus activated from outside.

The counter according to the invention can conveniently be isolated from external stimuli and can be reconfigured autonomously whenever it is appropriately stimulated. The base counter includes a plurality of N stages 1 in which the first stage is designated by the reference numeral 1a. The structure of the first stage can be particular, as described in detail hereinafter.

The plurality of N stages 1 are interfaced with an internal bus 2, to which each stage is directly connected by connection means 3. The connection means 3 may conveniently include, for example, a pass gate driven by an address latch enable signal ALE. The signal ALE is generated by an appropriately provided structure described hereinafter. The connection between the internal address bus 2 and the stages 1 of the counter therefore occurs from the bus 2 toward each stage through the pass gates 3.

Each counter stage is further connected to a fast carry structure which is formed by a NAND gate 5 to which an inverter 6 is cascade-connected. Output lines 7 from each counter stage 1 each provide an input to the NAND gate 5, an output of which is sent to the inverter 6 and to a successive stage 1 of the counter. In practice, as shown in FIG. 1, the stages of the counter are divided into blocks of three, four, four and four, for example, and there are four NAND gates 5 and a matching number of inverters 6. Therefore, the first group of three counter stages 1 has a corresponding NAND gate 5 to which it sends its outputs. The output of the NAND gate 5 is sent to the first counter stage 1 of the second group of four counter stages, whose outputs are in turn sent to a second NAND gate 5 to which an inverter 6 is in turn cascade-connected.

Likewise, the second group of four counter stages has a third NAND gate 5 to which its outputs (lines 7) are sent. The output of the third NAND gate 5 is sent to the first counter stage 1 of the third group of four counter stages. Finally, the third group of four counter stages has a fourth NAND gate 5 to which it sends its outputs. The number of counter stages shown in FIG. 1 is of course merely an example.

The fast carry structures are used to reduce the carry propagation time. The output of the second NAND gate 5 (and of the corresponding inverter 6) and the output of the fourth NAND gate 5 and of the corresponding inverter 6 are, respectively, a column carry signal COL_CARRY and its inverted equivalent COL_CARRYN, and a row carry signal ROW_CARRY.

The output of the fourth inverter 6, which is cascade-connected to the fourth NAND gate 5, is provided to a further pass-gate 8. The pass-gate 8 is driven by a signal COUNT_CHECK which is used during counter testing before the device is deemed suitable for the intended operation. The pass-gate 8 is directly interfaced with a data bus DATA_BUS, which is the main bus of the memory and transfers all the data to and from the memory. The lines 7 output from each of the counter stages 1 are further directly interfaced with an internal row address bus 10 and with an internal column address bus 11, which are respectively connected to row and column redundancy structures (not shown).

The signal ALE (address latch enable) is generated, as explained earlier, by a circuit structure 15 which generates, from a signal ALE 16 which is external to the memory, a signal ALE-fast. After an appropriate delay 17, the circuit structure 15 generates a signal ALE which is true. That is, the signal ALE is a genuine address latch enable signal which is not dictated by false stimuli that reach the memory.

A structure 15 for generating the signal ALE is the subject of a co-pending patent application also assigned to the present assignee, which is hereby incorporated herein in its entirety by reference. The signal ALE-fast drives the transfer of an external address 18 of the memory through an inverter 19 to a latch structure 20. The external address 18 is stored in the latch structure 20 and then sent on the internal address bus 2. The signal ALE, i.e., the signal ALE which is assuredly intended for the memory, is instead used to drive the transfer of the external address 18 present on the address bus 2 from the address bus to each counter stage 1.

FIG. 1 is a schematic block diagram of a counter for a memory in which, in summary, some stages 1 of the counter, specifically the stages arranged above the internal address bus 2 in the figure, are meant to count the column address. The stages arranged below the internal bus 2 (as seen in FIG. 1) are dedicated to row carry. The two groups of stages, arranged above and below the internal address bus 2, are in turn divided into two sub-groups which are mutually connected by the fast carry structures, as explained earlier.

The counter is further driven by an increment pulse INC which is generated by an appropriate circuit structure. This circuit structure is the subject of a co-pending patent application assigned to the present assignee, which is hereby incorporated herein in its entirety by reference. The pulse is input to a clock signal generation circuit 21 which emits signals M_INC and S_INC, which are respectively sent to each stage 1 of the counter according to the invention.

The increment pulse INC is, by construction, very narrow (with respect to the interval between two successive increments), to allow frequency maximization, since:

if INC=1 narrow, this entails minimum time for updating the counter;

if INC=0 wide, this means that the maximum time interval is available for calculating the carry.

In view of the fundamental structure of each stage 1 of the counter, stage updating is substantially instantaneous and simultaneous for all the stages 1. The clock signals M_INC and S_INC are therefore derived from the increment pulse INC and do not temporally overlap (i.e., they are not simultaneously active). This reduces the possibility of internal acceleration of the counter (i.e., "runaway" effects).

FIG. 2 is a diagram of the circuit 21 for generating clock signals M_INC and S_INC and the respective inverted signals M_INCn and S_INCn. Each counter stage 1 is connected to the adjacent counter stage and outputs to it an output carry signal 24 and an address signal 25, which are then transferred to the adjacent stage 1. This connection applies to each stage 1 of the counter.

The circuit details of one of the stages 1 of the counter according to the invention (shown in FIG. 1) and the first stage 1a of the counter are now described with reference to FIGS. 3 and 4, respectively. The column carry signal COL_CARRY and its inverted form COL_CARRYN, produced by the second NAND gate 5 and by the corresponding second inverter 6, are input to the first counter stage 1 of the counter stages meant to provide row carry counting. The column carry signal COL_CARRY is also input to the third NAND gate 5.

Figure 4:
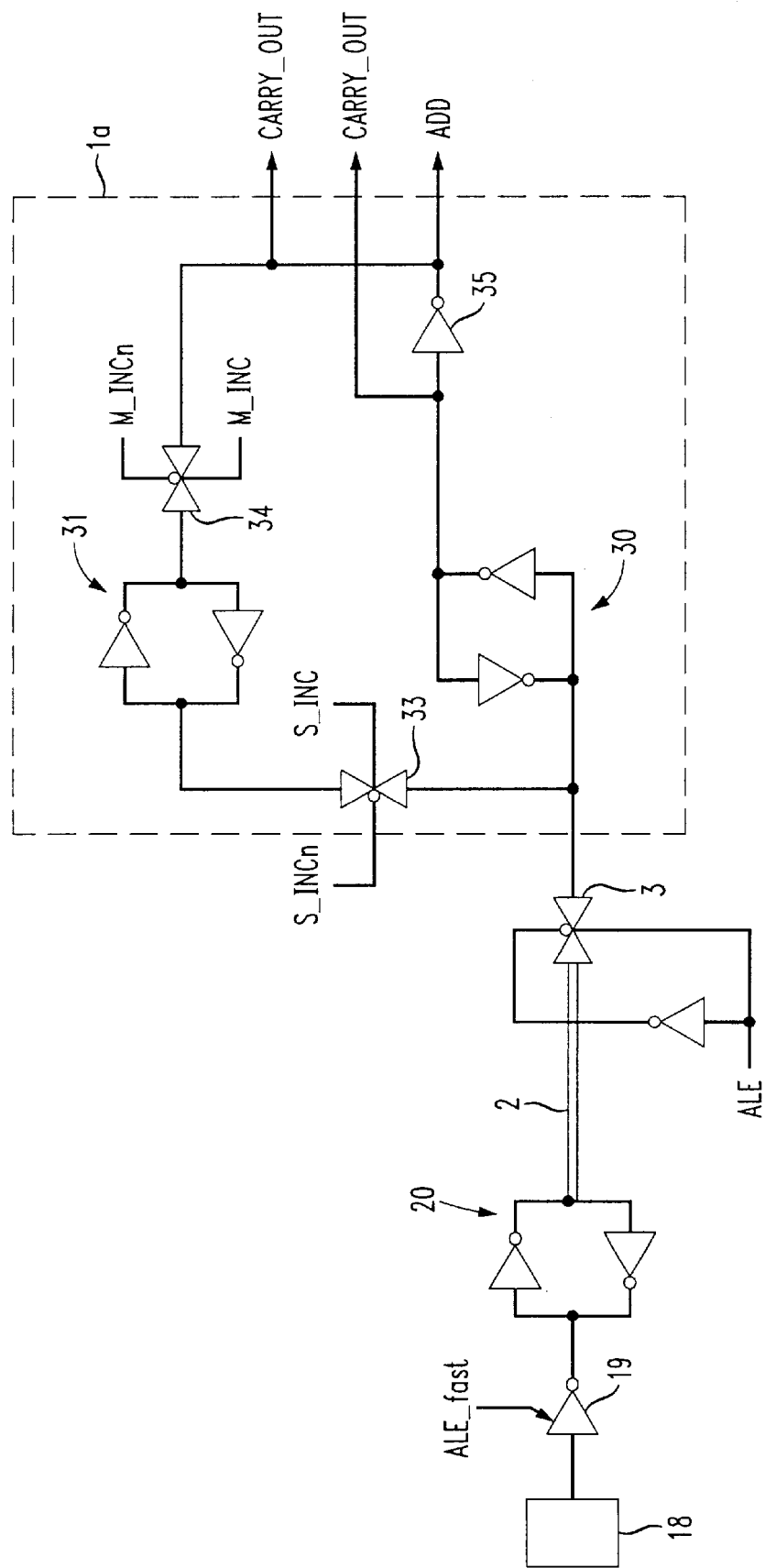
FIG. 4 is a schematic circuit diagram of the first stage of the counter according to the present invention.

FIG. 4 shows the first stage 1a of the counter according to the invention and the circuit structure upstream of each counter stage. This circuit is formed by the external address 18, by the inverter 19 which is driven by the signal ALE-fast, by the latch means 20 which interfaces with the bus 2, and the pass-gate 3 which is driven by the signal ALE.

The counter stage 1a is illustratively shown with dashed-lines in FIG. 4 and includes two latch structures. These are a master latch structure 30 and a slave latch structure 31. The master latch structure 30 and the slave latch structure 31 are mutually connected by first and second means 33, 34 for enabling connection between the latch structures. The means 33, 34 may be pass gates, for example.

Moreover, at the output of the master latch structure 30 there is provided an inverter 35. The enabling means 33 and 34 are respectively driven by the clock signals S_INC (S_INCn) and M_INC (M_INCn), explained earlier, and generated by the clock signal generation circuit 21. The output of the first counter stage includes a carry output signal CARRY_OUT, by its inverted form CARRY_OUTN, and by the address signal ADD.

FIG. 3 illustrates a stage 1 of the counter according to the invention, i.e., one of the stages that follows the first stage 1a. The difference between the first counter stage 1a shown in FIG. 4 and the generic counter stage 1 shown in FIG. 3 is that each counter stage 1 after the first counter stage 1a has a connection between the latch structure 30 and the latch structure 31. This connection may occur along two mutually different paths following an inversion produced by the inverter 14.

In practice, each counter stage after the first counter stage 1a has a first path between the master structure 30 including means 40 for enabling connection between the latch structure 30 and the latch structure 31, which are enabled by the presence (or absence) of an input carry signal CARRY_IN. The connection enabling means may conveniently be a pass gate. Likewise, the second path for connection between the master latch structure 30 and the slave latch structure 31 (i.e., the path from the output of the inverter 14 to the slave structure (latch) 11) is controlled by a second connection enabling means 41, which may also conveniently be a pass gate.

The input carry signal CARRY_IN is fed to the N-channel transistor of the connection enabling means 40, while the signal CARRY_INN (i.e., the inverted form of the preceding signal) is fed to the P-channel transistors of the first connection enabling means 40 and to the N-channel transistors of the second connection enabling means 41. The inverted input carry signal (CARRY_INN) is also input to carry forming means, conveniently including a pass gate 42 and a P-channel transistor 43 whose gate terminal receives as an input the carry signal CARRY_IN. The inverted input carry signal (CARRY_INN) is instead sent to the P-channel transistor of the pass gate 42, whose N-channel transistor is connected to the gate terminal of the P-channel transistor 43. In the P-channel transistor 43, the drain terminal is connected to means 44 for buffering the output carry (CARRY_OUT) which outputs the output carry. The inverted output carry CARRY_OUTN is instead emitted by the pass gate 42.

The counter circuit according to the invention therefore can be configured externally by the external address signal at each count start, internally updated during counting, and is substantially functionally insensitive to external stimuli during counting activity (i.e., when the signal ALE is off). Each stage of the counter may be updated simultaneously and instantaneously with respect to all the other stages. The association with the fast carry network allows reduction of the carry propagation time, thus increasing the operating frequency.

Moreover, the fast carry network allows for monitoring the functionality of the counter from outside. By initializing the counter in the all-zero configuration and stimulating the counter with an adapted number of clock pulses (equal to the maximum count) it is possible, by observing the compatibility of the switching (from 0 to 1) of the row carry signal ROW_CARRY (global carry) with the number of the clock pulses, to monitor the correctness of the count and therefore the integrity of the counter.

This particular monitoring method allows selection, at the beginning of the testing activities, of the integrity of the addressing structures, limiting the long validation sequences only to the functionally addressable devices. The particular input stage of the counter allows two-step acquisition of an external address, driven by the signal ALE, which accordingly allows protection against improper external loading.

Moreover, the particular input stage of the counter allows isolation of the internal lines of the counter. This reduces unnecessary consumption in the interface section, facilitates noise immunity and freezes the initial configuration of the bus at its first loading so that at a generic instant both the current address and the initial address are present. This is due to the fact that the external address 18 is loaded in the latch structure 20 and the subsequent transfer from the bus 2 to the stages 1 of the counter is driven by the signal ALE. In the absence of such signal, the counter produces the current address and its initial address is still loaded in the bus.

In practice it has been observed that the counter circuit according to the invention fully achieves the intended objects. That is, it provides greater speed of operation, adequate insensitivity to improper loading, and allows monitoring of its functional integrity from outside.

The counter circuit thus conceived is susceptible to numerous modifications and variations, all of which are within the scope of the inventive concept. The above details may furthermore be replaced with other technically equivalent elements. Where technical features mentioned in any claim are followed by reference signs, those reference signs have been included for the sole purpose of increasing the intelligibility of the claims and accordingly such reference signs do not have any limiting effect on the scope of each element identified by way of example by such reference signs.

That which is claimed is:

1. A memory counter circuit comprising:
    a plurality of counter stages;
    an internal address bus for sending an external address signal to each of said counter stages;
    a loading circuit for loading the external address signal onto said internal address bus;
    an enabling circuit for enabling connection between said internal address bus and each of said counter stages based upon a true address latch enable signal;
    a circuit for generating the true address latch enable signal based upon an external address latch signal and a fast address latch enable signal for driving said loading circuit; and
    a clock for generating clock signals, not simultaneously active, for synchronizing each one of said counter stages.

2. The memory counter circuit according to claim 1 further comprising a fast carry network connected to each of said counter stages.

3. The memory counter circuit according to claim 2 wherein said counter stages are divided into a first group of counter stages for counting a row carry and a second group of counter stages for counting a column carry, the column carry being input to a first one of said counter stages in said first group of counter stages.

4. The memory counter circuit according to claim 3 wherein each of said first and second groups of counter stages is divided into two subgroups of counter stages which are each connected to said fast carry network.

5. The memory counter circuit according to claim 4 wherein each of said counter stages is connected to a corresponding portion of said fast carry network by an output line.

6. The memory counter circuit according to claim 5 wherein said fast carry network portion comprises an inverter and a NAND gate cascade-connected to said inverter; wherein each output line provides an address signal from its respective counter stage to said fast carry network portion; and wherein the address signal of each counter stage is input to said NAND gate.

7. The memory counter circuit according to claim 6 further comprising a redundancy bus; and wherein each output line of each of said counter stages is connected to said redundancy bus.

8. The memory counter circuit according to claim 5 further comprising a pass gate connected to an output of said fast carry network portion corresponding to said first group of counter stages; and wherein said pass gate is driven by a counter count check signal.

9. The memory counter circuit according to claim 1 wherein said clock receives as an input an incrementing signal for incrementing the memory counter circuit.

10. The memory counter circuit according to claim 9 wherein the incrementing signal has a negligible duration with respect to an interval between two successive increment signals.

11. The memory counter circuit according to claim 1 wherein each of said counter stages sends an output carry signal and an inverted output carry signal to a counter stage adjacent thereto.

12. The memory counter circuit according to claim 1 wherein said enabling circuit comprises a respective pass gate for each one of said counter stages; and wherein said pass gate is driven by said true address latch enable signal.

13. The memory counter circuit according to claim 1 wherein said circuit for generating the true latch enable signal comprises a delay circuit for delaying the external address latch signal.

14. A memory counter circuit comprising:
    a plurality of counter stages connected together;
    an internal address bus for sending an external address signal to each one of said counter stages;
    a loading circuit for loading the external address signal onto said internal address bus;
    an enabling circuit for enabling connection between said internal address bus and each one of said counter stages based upon an address latch enable signal;
    a circuit for generating the address latch enable signal based upon an external address latch signal and a fast address latch enable signal for driving said loading circuit;
    a clock for generating clock signals for synchronizing each one of said counter stages; and
    a fast carry network connected to each of said counter stages.

15. The memory counter circuit according to claim 14 wherein the address latch enable signal comprises a true address latch enable signal.

16. The memory counter circuit according to claim 14 wherein the clock signals are not simultaneously active.

17. The memory counter circuit according to claim 16 wherein said counter stages are divided into a first group of counter stages for counting a row carry and a second group of counter stages for counting a column carry, the column carry being input to a first one of said counter stages in said first group of counter stages.

18. The memory counter circuit according to claim 17 wherein each of said first and second groups of counter stages is divided into two subgroups of counter stages which are each connected to said fast carry network.

19. A memory counter circuit comprising:
a plurality of counter stages connected together;
an internal address bus for sending an external address signal to each one of said counter stages;
a loading circuit for loading the external address signal onto said internal address bus;
an enabling circuit for enabling connection between said internal address bus and each one of said counter stages based upon an address latch enable signal;
a circuit for generating the address latch enable signal based upon an external address latch signal and a fast address latch enable signal for driving said loading circuit; and
a clock for generating clock signals for synchronizing each one of said counter stages.

20. The memory counter circuit according to claim 19 wherein the address latch enable signal comprises a true address latch enable signal.

21. The memory counter circuit according to claim 19 wherein the clock signals are not simultaneously active.

22. The memory counter circuit according to claim 19 further comprising a fast carry network connected to each of said counter stages.

23. The memory counter circuit according to claim 22 wherein said counter stages are divided into a first group of counter stages for counting a row carry and a second group of counter stages for counting a column carry, the column carry being input to a first one of said counter stages in said first group of counter stages.

24. The memory counter circuit according to claim 23 wherein each of said first and second groups of counter stages is divided into two subgroups of counter stages which are each connected to said fast carry network.

25. A memory comprising:
an internal data bus; and
a counter circuit connected to said internal data bus and comprising
a plurality of counter stages connected together,
an internal address bus for sending an external address signal to each one of said counter stages,
a loading circuit for loading the external address signal onto said internal address bus,
an enabling circuit for enabling connection between said internal address bus and each one of said counter stages based upon an address latch enable signal,
a circuit for generating the address latch enable signal based upon an external address latch signal and a fast address latch enable signal for driving said loading circuit, and
a clock for generating clock signals for synchronizing each one of said counter stages.

26. The memory according to claim 25 wherein the address latch enable signal comprises a true address latch enable signal.

27. The memory according to claim 25 wherein the clock signals are not simultaneously active.

28. The memory according to claim 25 further comprising a fast carry network connected to each of said counter stages.

29. The memory according to claim 28 wherein said counter stages are divided into a first group of counter stages for counting a row carry and a second group of counter stages for counting a column carry, the column carry being input to a first one of said counter stages in said first group of counter stages.

30. The memory according to claim 29 wherein each of said first and second groups of counter stages is divided into two subgroups of counter stages which are each connected to said fast carry network.

31. A method for decreasing read time of a memory comprising a plurality of counter stages connected together, the method comprising:
sending an external address signal to each of the counter stages using an internal address bus;
enabling a connection between the internal address bus and each of the counter stages responsive to an address latch enable signal;
generating the address latch enable signal based upon an external address latch signal and a fast address latch enable signal; and
generating clock signals for synchronizing each one of the counter stages.

32. The method according to claim 31 wherein generating the address latch enable signal comprises generating a true address latch enable signal.

33. The method according to claim 31 wherein generating clock signals comprises generating clock signals that are not simultaneously active.

34. The method according to claim 31 further comprising connecting a fast carry network to each of the counter stages.

35. The method according to claim 34 further comprising dividing the counter stages into a first group of counter stages for counting a row carry and a second group of counter stages for counting a column carry, the column carry being input to a first one of the counter stages in the first group of counter stages.

36. The method according to claim 35 further comprising dividing each of the first and second groups of counter stages into two subgroups of counter stages each connected to the fast carry network.

* * * * *